United States Patent
Siemieniec et al.

(10) Patent No.: US 10,553,685 B2
(45) Date of Patent: Feb. 4, 2020

(54) SIC SEMICONDUCTOR DEVICE WITH OFFSET IN TRENCH BOTTOM

(71) Applicant: Infineon Technologies AG, Neubiberg (DE)

(72) Inventors: Ralf Siemieniec, Villach (AT); Thomas Aichinger, Faak am See (AT); Romain Esteve, Munich (DE); Daniel Kueck, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/959,661

(22) Filed: Apr. 23, 2018

(65) Prior Publication Data

US 2018/0308938 A1    Oct. 25, 2018

(30) Foreign Application Priority Data

Apr. 24, 2017    (DE) .................. 10 2017 108 738

(51) Int. Cl.
*H01L 29/16*    (2006.01)
*H01L 29/66*    (2006.01)
*H01L 29/78*    (2006.01)

(52) U.S. Cl.
CPC .... *H01L 29/1608* (2013.01); *H01L 29/66734* (2013.01); *H01L 29/7813* (2013.01)

(58) Field of Classification Search
CPC ......... H01L 21/76229; H01L 21/76232; H01L 21/76237; H01L 21/76816; H01L 29/4236; H01L 29/66704; H01L 29/66734; H01L 29/7813
See application file for complete search history.

(56) References Cited

U.S. PATENT DOCUMENTS

| 6,348,712 B1 * | 2/2002 | Korec | H01L 29/0626 257/330 |
| 7,355,244 B2 * | 4/2008 | Gonzalez | H01L 21/28185 257/330 |
| 7,423,318 B2 * | 9/2008 | Suh | H01L 27/10876 257/332 |

(Continued)

FOREIGN PATENT DOCUMENTS

| DE | 102013214196 A1 | 1/2014 |
| JP | 2014207326 A | 10/2014 |

(Continued)

*Primary Examiner* — Dale E Page
*Assistant Examiner* — Quovaunda Jefferson
(74) *Attorney, Agent, or Firm* — Murphy, Bilak & Homiller, PLLC

(57) ABSTRACT

A semiconductor device includes a trench extending from a first surface into a SiC semiconductor body. The trench has a first sidewall, a second sidewall opposite to the first sidewall, and a trench bottom. A gate electrode is arranged in the trench and is electrically insulated from the SiC semiconductor body by a trench dielectric. A body region of a first conductivity type adjoins the first sidewall. A shielding structure of the first conductivity type adjoins at least a portion of the second sidewall and the trench bottom. A first section of the trench bottom and a second section of the trench bottom are offset to one another by a vertical offset along a vertical direction extending from the first surface to a second surface of the SiC semiconductor body opposite to the first surface.

24 Claims, 12 Drawing Sheets

(56) References Cited

U.S. PATENT DOCUMENTS

| | | | |
|---|---|---|---|
| 7,932,554 B2* | 4/2011 | Kim | H01L 29/1037 |
| | | | 257/315 |
| 2004/0203200 A1* | 10/2004 | Williams | H01L 29/0878 |
| | | | 438/202 |
| 2006/0281249 A1* | 12/2006 | Yilmaz | H01L 29/66727 |
| | | | 438/243 |
| 2009/0114969 A1* | 5/2009 | Suzuki | H01L 29/0619 |
| | | | 257/301 |
| 2011/0018029 A1* | 1/2011 | Pfirsch | H01L 29/0696 |
| | | | 257/147 |
| 2014/0021484 A1* | 1/2014 | Siemieniec | H01L 21/049 |
| | | | 257/77 |

FOREIGN PATENT DOCUMENTS

| | | |
|---|---|---|
| JP | 2015226060 A | 12/2015 |
| JP | 2016136618 A | 7/2016 |
| JP | 2017063182 A | 3/2017 |
| WO | 2014122919 A1 | 8/2014 |

* cited by examiner

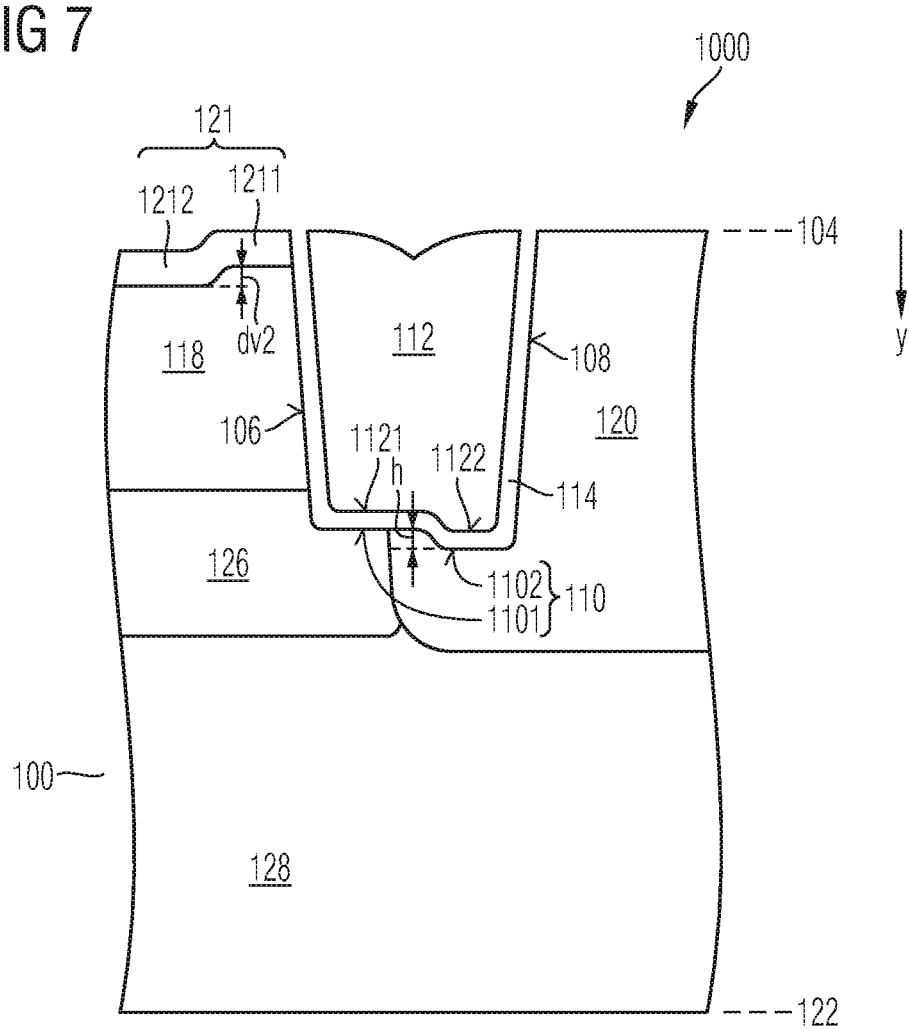

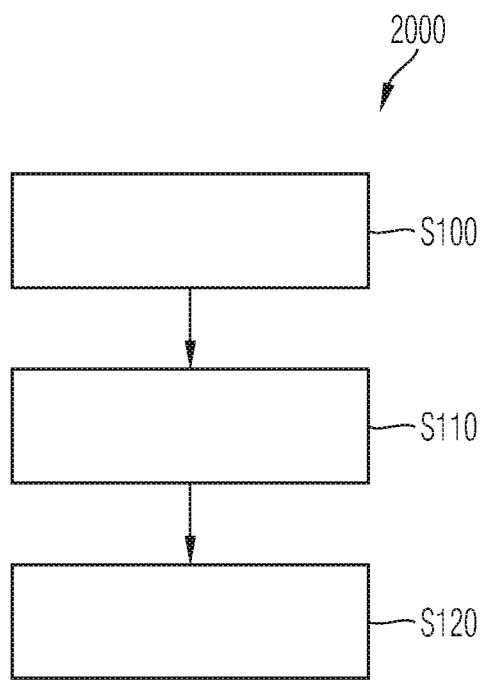

SIC SEMICONDUCTOR DEVICE WITH OFFSET IN TRENCH BOTTOM

BACKGROUND

Wide-bandgap semiconductor devices are based on a semiconductor material with a bandgap of at least 2 eV or at least 3 eV and allow for lower on-state resistance, operation at high temperatures, lower switching losses and lower leakage currents compared to conventional silicon-based semiconductor devices. Semiconductor devices based on wide-bandgap materials may include transistor cells with stripe-shaped trench gate electrodes that control transistor channels in only one of two opposite longitudinal mesa sidewalls of mesa portions formed from the semiconductor material between neighboring trench gate structures.

It is desirable to improve device characteristics of SiC semiconductor devices with trench gates and to further expand the range of applications for such devices.

SUMMARY

The present disclosure relates to a semiconductor device comprising a trench extending from a first surface into a SiC semiconductor body. The trench has a first sidewall, a second sidewall opposite to the first sidewall, and a trench bottom. An electrode, which may be a gate electrode, is arranged in the trench and is electrically insulated from the semiconductor body by a trench dielectric, which may be a gate dielectric. A body region of a first conductivity type adjoins the first sidewall. A shielding structure of the first conductivity type adjoins at least a portion of the second sidewall and the trench bottom. A first section of the trench bottom and a second section of the trench bottom are offset to one another by a vertical offset along a vertical direction extending from the first surface to a second surface of the SiC semiconductor body opposite to the first surface.

The present disclosure also relates to a method of manufacturing a semiconductor device. The method comprises forming a first trench into a SiC semiconductor body from a first surface. The method further comprises forming a shielding structure of a first conductivity type in the SiC semiconductor body by introducing dopants of the first conductivity type through a bottom of the first trench into the SiC semiconductor body. The method further comprises forming a second trench into the SiC semiconductor body from the first surface, wherein the second trench extends deeper into the SiC semiconductor body than the first trench, and the first trench and the second trench laterally merge one another, thereby setting a second section of a trench bottom of the second trench deeper in the SiC semiconductor body than a first section of the trench bottom of the second trench.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments and together with the description serve to explain principles of the invention. Other embodiments of the invention and intended advantages will be readily appreciated as they become better understood by reference to the following detailed description.

FIG. 7 is a cross-sectional view of a SiC semiconductor body for illustrating a current spread zone adjoining a body region.

FIG. 9 is a schematic flow-chart for illustrating a method of manufacturing a semiconductor device in a SiC semiconductor body.

DETAILED DESCRIPTION

Figure 1:
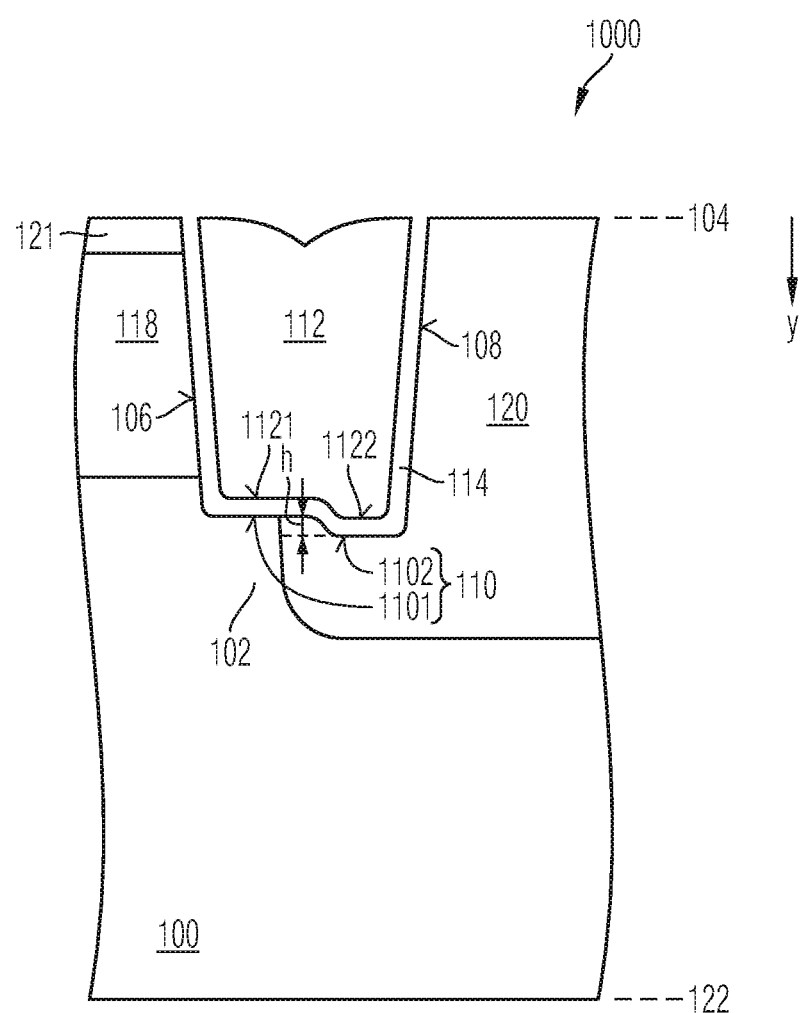
FIG. 1 is a cross-sectional view of a SiC semiconductor body for illustrating a semiconductor device having a vertical offset at a trench bottom.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "–" or "+" next to the doping type "n" or "p". For example, "n⁻" means a doping concentration that is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped.

FIG. 1 is a schematic cross-sectional view of a portion of a SiC semiconductor body 100 for illustrating a semiconductor device 1000.

A trench 102 extends into the SiC semiconductor body 100 from a first surface 104. The trench has a first sidewall 106, a second sidewall 108 opposite to the first sidewall 106, and a trench bottom 110. An electrode 112 is arranged in the trench 102 and is electrically insulated from the semiconductor body 100 by a trench dielectric 114. It is possible that only one electrode 112 is arranged in the trench 102. The electrode 112 may be a gate electrode and the trench dielectric 114 may be a gate dielectric.

A body region 118 of a first conductivity type adjoins the first sidewall 106. A shielding structure 120 of the first conductivity type adjoins at least a portion of the second sidewall 108 and the trench bottom 110. Along a vertical direction y extending from the first surface 104 to a second surface 122 of the SiC semiconductor body 100 opposite to the first surface 104, a first section 1101 of the trench bottom 110 and a second section 1102 of the trench bottom 110 are offset to one another by a vertical offset (height or distance) h. The vertical offset h may range from 10 nm to 100 nm, for example.

The shielding structure 120 may allow for achieving a desired reliability of the semiconductor device 1000 under blocking conditions by limiting an electric field strength in the trench dielectric 114, for example at a trench corner located at a transition between the first section 1101 and the first sidewall 106. Since a maximum electric field strength may be located in a portion of the shielding structure 120 below the trench bottom 110, extending a depth of the shielding structure 120 may allow for a reduction of the electric field strength at the trench corner, thereby improving device reliability. Thus, by providing the vertical offset h between the first section 1101 of the trench bottom 110 and the second section 1102 of the trench bottom 110, a distance from the trench corner at the first sidewall 106 to a position of maximum electric field strength within the shielding structure 120 may be increased, thereby allowing for an improved device reliability.

A source region 121 of the second conductivity type adjoins the first sidewall 106.

In one or more embodiments, the semiconductor device 1000 may include transistor cells and may be an IGFET (insulated gate field effect transistor), for example a MOSFET (metal oxide semiconductor FET) in the usual meaning concerning FETs with metal gates as well as FETs with gates based on doped semiconductor material, an IGBT (insulated gate bipolar transistor) or an MCD (MOS controlled diode), by way of example.

In one or more embodiments, a material of the SiC semiconductor body 100 is 2H-SiC (SiC of the 2H polytype), 6H-SiC or 15R-SiC. In one or more further embodiments, the semiconductor material of the SiC semiconductor body 100 is silicon carbide of the 4H polytype (4H-SiC).

The first sidewall 106 may be vertical to the first surface 104 or may taper with increasing distance to the first surface 104. In one or more embodiments, a sidewall plane of the first sidewall 106 is formed by a main crystal plane providing high charge carrier mobility, e.g., a (11-20) crystal plane.

The electrode 112 may be a gate electrode and may include or consist of a heavily doped polycrystalline silicon material and/or a metal-containing material.

In one or more embodiments, the second section 1102 of the trench bottom 110 is arranged deeper in the SiC semiconductor body 100 than the first section 1101 of the trench bottom 110. Thus, a vertical distance between the first section 1101 of the trench bottom 110 and a reference level at the first surface 104 is smaller than a vertical distance between the second section 1102 of the trench bottom 110 and the reference level.

In one or more embodiments, a second section 1122 of a bottom of the electrode 112 is arranged deeper in the SiC semiconductor body 100 along the vertical direction y than a first section 1121 of the bottom of the electrode 112. Thus, the first section 1121 of the bottom of the electrode 112 and the second section 1122 of the bottom of the electrode 112 are offset to one another, for example by a vertical offset corresponding to the vertical offset h between the first section 1101 of the trench bottom 110 and the second section 1102 of the trench bottom 110.

Figure 2:
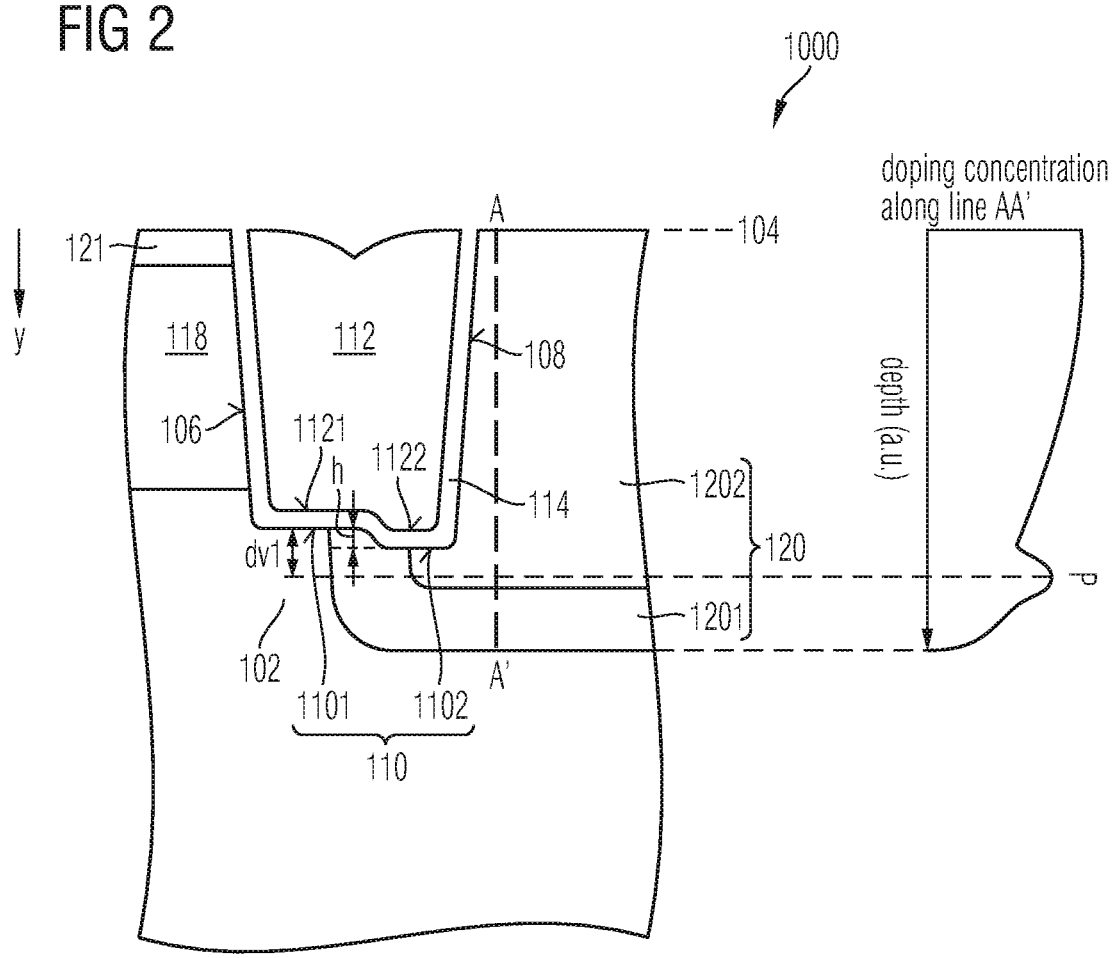
FIG. 2 is a cross-sectional view of a SiC semiconductor body for illustrating a shielding structure adjoining a sidewall and a bottom side of a trench.

Referring to the schematic cross-sectional view illustrated in FIG. 2, in one or more embodiments, the shielding structure 120 includes a shielding region 1201 of the first conductivity type and a connection region 1202 of the first conductivity type. The connection region 1202 is arranged between the shielding region 1201 and the first surface 104. A doping concentration profile of the shielding structure 120 (see exemplary illustration in right part of FIG. 2) has a peak P along the vertical direction y that is located deeper in the SiC semiconductor body 100 than the trench bottom 110.

In one or more embodiments, a vertical distance dv1 between the first section 1101 of the trench bottom 110 and the peak P of the shielding region ranges from 200 nm to 800 nm, or from 300 nm to 500 nm, for example.

Figure 3:
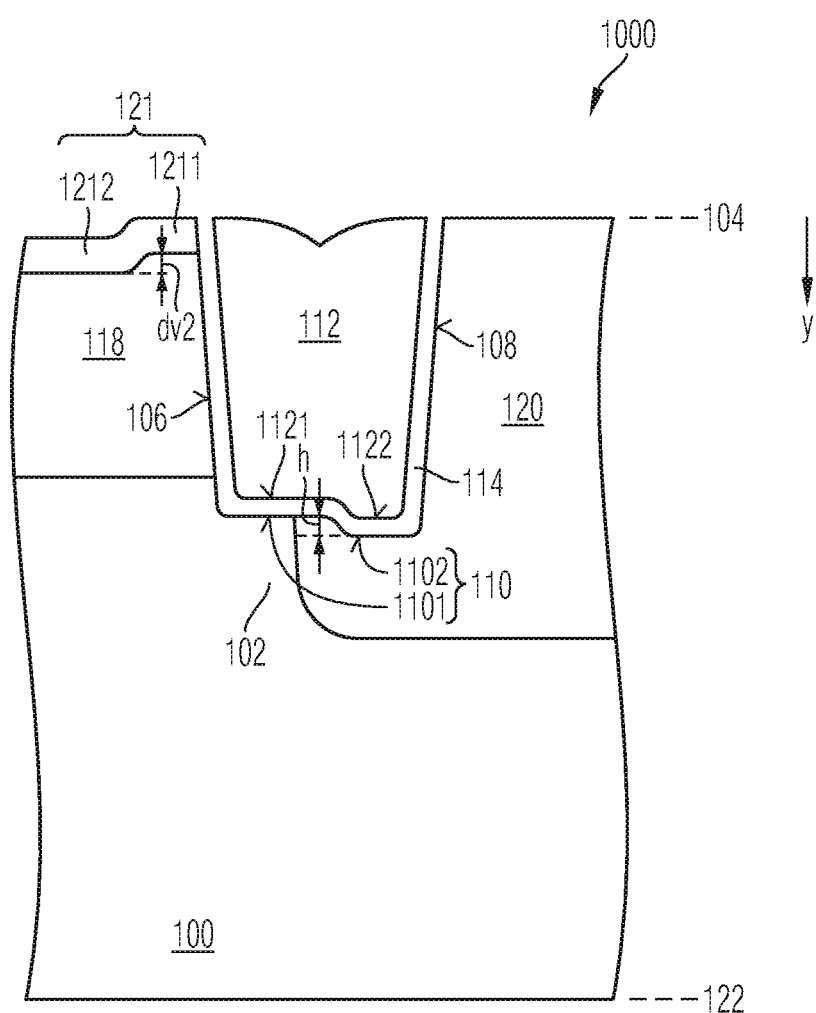
FIG. 3 is a cross-sectional view of a SiC semiconductor body for illustrating a source region having an offset at a bottom side.

Referring to the schematic cross-sectional view illustrated in FIG. 3, in one or more embodiments, a first portion 1211 of the source region 121 is arranged between the first sidewall 106 of the trench 102 and a second portion 1212 of the source region 121, and a bottom of the second portion 1212 is arranged deeper in the SiC semiconductor body 100 along the vertical direction y than a bottom of the first portion 1211. A vertical distance dv2 between the bottom of the first portion 1211 of the source region 121 and the bottom of the second portion 1212 of the source region 121 may correspond to the vertical offset h.

In the embodiments illustrated in FIGS. 1 to 3, the shielding structure 120 adjoins the second sidewall 108 at the first surface 104. In the embodiments illustrated in FIGS. 1 to 3, the shielding structure 120 further adjoins the first surface 104. Thus, the source region 121 is absent at the second sidewall 108 and a channel conductivity may only be switched on and off at the first sidewall 106 by altering a voltage at the electrode 112.

Figure 4:
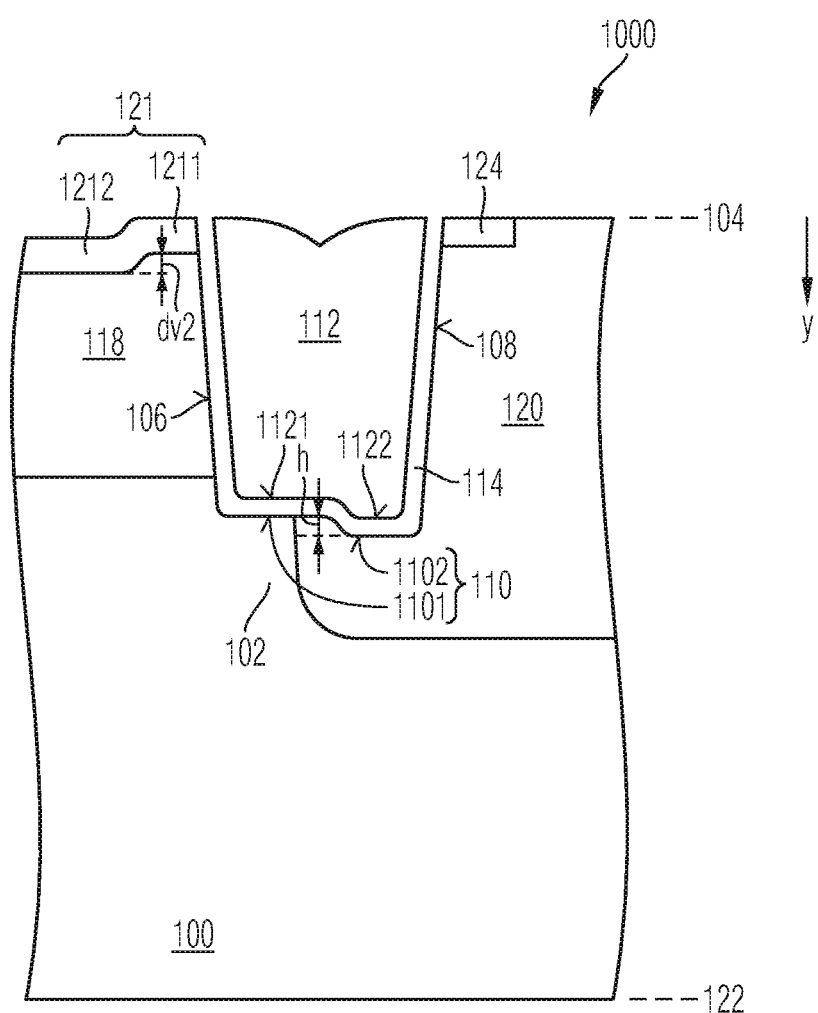
FIG. 4 is a cross-sectional view of a SiC semiconductor body for illustrating a region of the conductivity type of the source region that adjoins the trench at a sidewall opposite to the sidewall where the source region is located.

Referring to the schematic cross-sectional view of FIG. 4, the semiconductor device 1000 further comprises a region 124 of the second conductivity type adjoining the second sidewall 108 and the first surface 104. Due to different orientation with respect to the main crystal planes, a semiconductor interface of a portion of the trench dielectric 114 formed on the second sidewall 108 may contain more interface states for charge carriers than a portion of the trench dielectric 114 formed on the first sidewall 106 such that the threshold voltages and charge carrier mobility for inversion channels formed along the two sidewalls are different. For allowing a narrow specification of the threshold voltage, the source regions 121 is typically formed exclusively along the first sidewall 106, which is a main crystal plane, for example a (11-20) crystal plane, whereas formation of inversion channels along the second sidewall 108, which is tilted to main crystal planes, is typically suppressed by omitting the formation of source regions along the second sidewall 108. In addition, forming the source region 121 only along the first sidewall 106 may relax overlay tolerances for contact structures to the body region 118 and for other structures shielding the trench dielectric 114 against drain potential in a FET or against collector potential in an IGBT.

By contrast, forming the region 124 of the second conductivity type despite of all also at least along portions of the second sidewall 108 allows for increasing a gate-to-source capacitance Cgs without negative impact on other device parameters.

Figure 5:
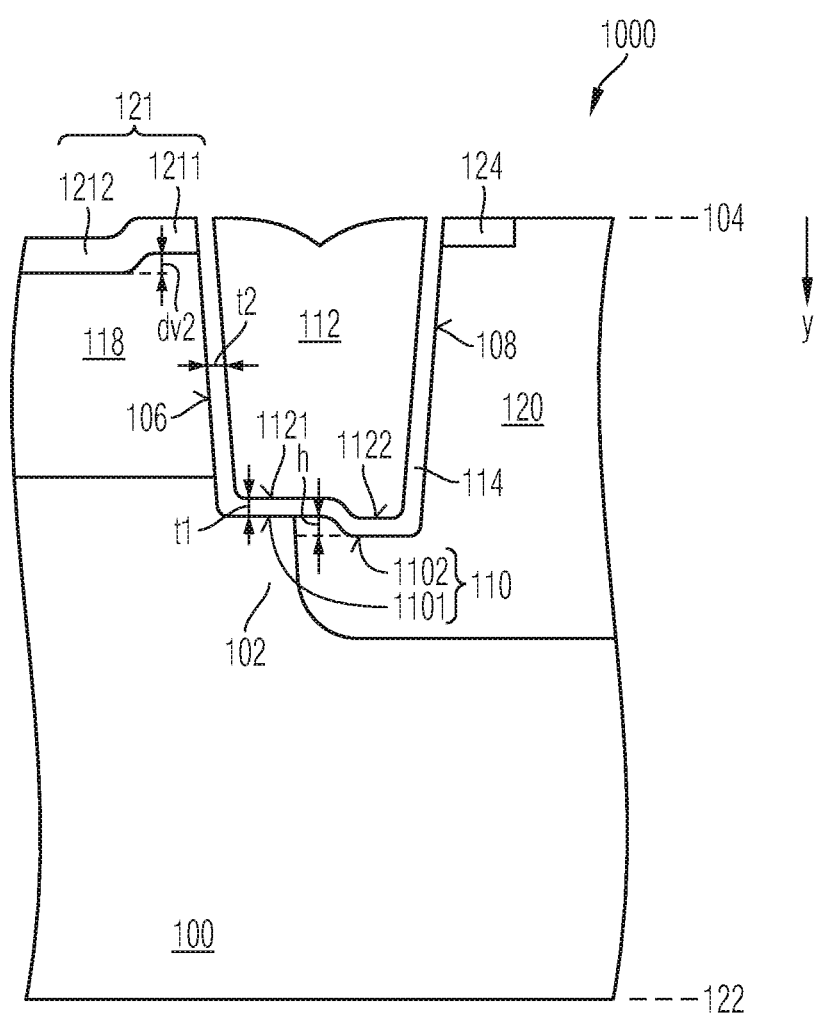
FIG. 5 is a cross-sectional view of a SiC semiconductor body for illustrating a trench dielectric having a larger thickness at the trench bottom than at trench sidewalls.

Referring to the schematic cross-sectional view of FIG. 5, a first thickness t1 of a first part of the trench dielectric 114 adjoining the trench bottom 110 is greater than a second thickness t2 of a second part of the trench dielectric 114 adjoining the first sidewall 106. The first thickness t1 may be larger than the thickness t2 by at least a factor of 1.1, or 1.5, or 2, or 3 or even by a factor larger than 3. In one or more embodiments, the second thickness t2 is at least 40 nm, or at least 60 nm, or at least 80 nm, or even larger than 80 nm. Increasing the thickness of the trench dielectric 114 at the trench bottom 110 compared to the thickness at the first sidewall 106 allows for an independent adjustment of device parameters associated with the trench dielectric 114 at the first sidewall 106, for example a threshold voltage, and device parameters associated with the trench dielectric 114 at the trench bottom 106, for example an impact on device reliability caused by a corner of the trench bottom 110 at the first sidewall 106.

Figure 6:
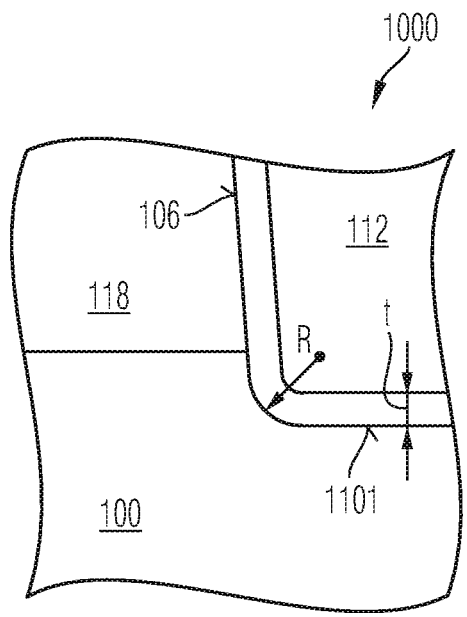
FIG. 6 is a cross-sectional view of a SiC semiconductor body for illustrating a trench having rounded corners at the trench bottom.

Referring to the schematic cross-sectional view of FIG. 6, in one or more embodiments, an interface between the trench dielectric 114 and the SiC semiconductor body 100 is rounded at a transition between the first section 1101 of the trench bottom 110 and the first sidewall 106. In one or more embodiments, a radius R of the curvature is at least twice a thickness t of the trench dielectric 114 adjoining the first sidewall 106, i.e. a relation R>2×t holds. Rounding the trench corner may allow for suppressing or reducing drawbacks that may be caused by process technology when forming the trench 102. One example of such a drawback may be a reduced thickness of the trench dielectric at the corner due to tolerances of the etch process as regards precision of taper that may reduce device reliability due to an increase of leakage currents and/or dielectric breakdown, for example. In one or more embodiments, radii of curvature may differ between opposite corners of the trench due to different taper angles of the first and second sidewalls 106, 108, for example.

Referring to the schematic cross-sectional view of FIG. 7, in one or more embodiments, the semiconductor device 1000 further comprises a current spread zone 126 of the second conductivity type and a drift zone 128 of the second conductivity type. The current spread zone 126 is arranged between the body region 118 and the drift zone 128. The current spread zone 126 adjoins the body region 118 and the shielding structure 120, and an average net doping concentration of the current spread zone 126 is greater than an average net doping concentration of the drift zone 128. In one or more embodiments, the average net doping concentration of the drift zone 128 is in a range from $10^{15}$ cm$^{-3}$ to $5\times10^{16}$ cm$^{-3}$, excluding any field stop zone(s) or highly doped contact zone for improving contact properties to a contact at the second surface 122. In one or more embodiments, the average net doping concentration of the current spread zone 126 is at least one order of magnitude, or two orders of magnitude or even larger than the average net doping concentration of the drift zone 128. This may allow for an improved electrical interconnection between the drift zone 128 and the channel region which is beneficial with respect to lowering the on-state resistance of the semiconductor device 1000, for example.

Figure 8A:
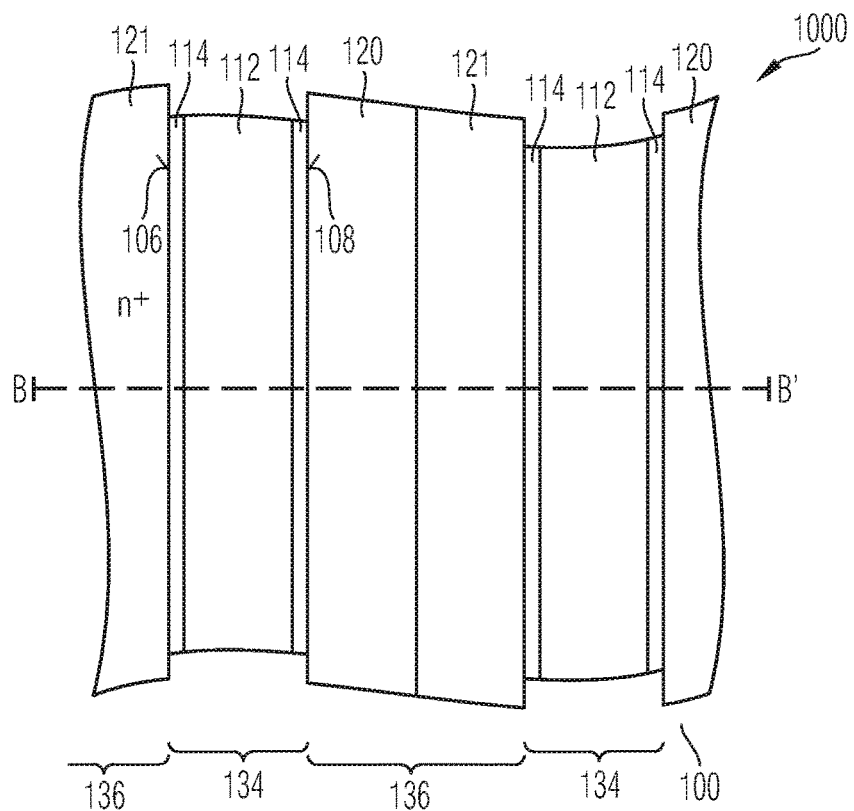
FIGS. 8A and 8B are schematic top and cross-sectional views of a SiC semiconductor body for illustrating transistor cells electrically connected in parallel.
Figure 8B:
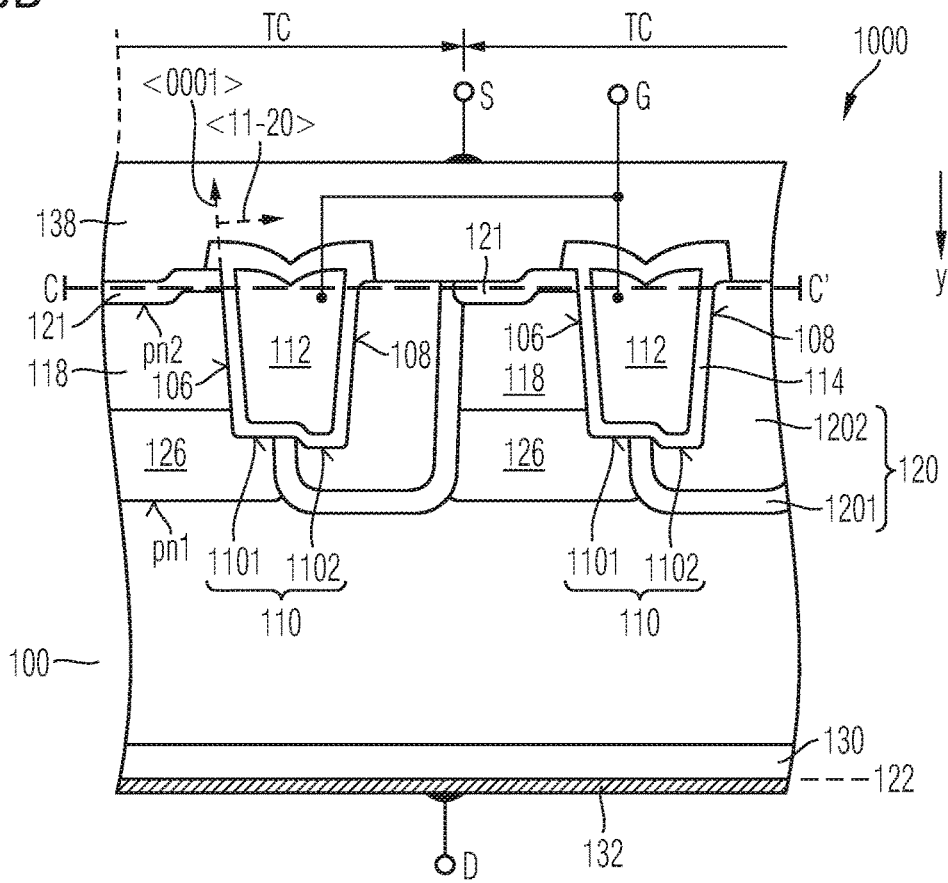

Referring to the schematic top and cross-sectional views of FIGS. 8A and 8B, the semiconductor device 1000 includes transistor cells TC electrically connected in parallel. Although illustrated in an exemplary design in FIGS. 8A, 8B, each one of the transistor cells may have a transistor cell unit design as illustrated in any one of the embodiments illustrated above with reference to FIGS. 1 to 7, for example. The semiconductor device 1000 may be or may include an IGFET (insulated gate field effect transistor), for example, an MOSFET (metal oxide semiconductor FET) in the usual meaning concerning FETs with metal gates as well as FETs with gates from semiconductor material, an IGBT (insulated gate bipolar transistor) or an MCD (MOS controlled diode), by way of example.

The first surface 104 may include coplanar surface sections. The first surface 104 may coincide with a main crystal plane or may be tilted to a main crystal plane by an off-axis angle α, which absolute value may be at least 2° and at most 12°, e.g., about 4°.

In the illustrated embodiment, the <0001> crystal axis is tilted by an off-axis angle α>0 to the normal and the <11-20> crystal axis is tilted by the off-axis angle α with respect to a horizontal plane. The <1-100> crystal axis is orthogonal to the cross-sectional plane.

In one or more embodiments, the first surface 104 may be serrated and includes parallel first surface sections shifted to each other and tilted to a horizontal plane by the off-axis angle α as well as second surface sections tilted to the first surface sections and connecting the first surface sections such that cross-sectional line of the serrated first surface 104 approximates a saw-tooth line. The first surface 104 may also include, per unit cell area, two surface sections that are offset to one another by a vertical offset.

At a rear side of the SiC semiconductor body 100 the second surface 122 may extend parallel to the first surface 104. A total thickness of the SiC semiconductor body 100 between the first and second surfaces 104, 122 may be in the range of several ten μm to several hundred μm. The normal to the first surface 104 defines the vertical direction y and directions parallel to the first surface 104 are horizontal directions.

The drift zone 128 may adjoin a heavily doped contact structure 130 that directly adjoins the second surface 122.

The heavily doped contact structure 130 may be or may include a SiC substrate and forms an ohmic contact with a second load electrode 132 that directly adjoins the second surface 122. A mean dopant concentration in the contact structure 130 is set sufficiently high to ensure an ohmic contact with the second load electrode 132. In case the semiconductor device 1000 is or includes an IGFET, the contact structure 130 has the same conductivity type as the drift zone 128. In case the semiconductor device 1000 is an IGBT, the contact structure 130 has the complementary conductivity type of the drift zone 128 or includes zones of both conductivity types.

The drift zone 128 may be formed in a layer grown by epitaxy on the contact structure 130, for example. A mean net dopant concentration in the drift zone 128 may be in the range from $10^{15}$ cm$^{-3}$ to $5\times10^{16}$ cm$^{-3}$, for example. Further doped regions, for example field stop zones or barrier zones of the conductivity type of the drift zone 128 or counter-doped regions may be arranged between the drift zone 128 and the contact structure 130.

The drift zone 128 may directly adjoin the contact structure 130 or a buffer layer forming a unipolar homojunction with the drift zone 128 may be arranged between the drift zone 128 and the contact structure 130, wherein a vertical extension of the buffer layer may be, for example approximately around one or a few μm and a mean dopant concentration in the buffer layer may be in a range from $3\times10^{17}$ cm$^{-3}$ to $10^{18}$ cm$^{-3}$, by way of example. The buffer layer may relax mechanical stress in the SiC semiconductor body 100 and/or may contribute to setting an electric field profile.

The transistor cells TC are formed along trench structures 134 that extend from the first surface 104 into the semiconductor body 100 such that mesa portions 136 of the SiC semiconductor body 100 separate neighboring trench structures 134.

A longitudinal extension of the trench structures 134 along a first horizontal direction is greater than a transverse extension along a second horizontal direction orthogonal to the first horizontal direction. The trench structures 134 may be long stripes extending from one side of a transistor cell region to an opposite side, wherein the length of the trench structures 134 may be up to several millimeters, for example. According to other embodiments a plurality of separated trench structures 134 may be formed along a line extending from one side of the transistor cell region to the opposite side, or the trench structures 134 may form a grid with the mesa portions 136 formed in the meshes of the grid.

At the bottom, the trench structures 134 may be rounded, for example as illustrated and described with reference to FIG. 6.

The trench structures 134 may be equally spaced, may have equal width, and may form a regular pattern, wherein a pitch (center-to-center distance) of the trench structures 134 may be in a range from 1 μm to 10 μm, e.g., from 2 μm to 5 μm.

A vertical extension of the trench structures 134 may be in a range from 0.3 μm to 5 μm, e.g., in a range from 0.5 μm to 2 μm.

The trench structures 134 may be vertical to the first surface 104 or may taper with increasing distance to the first surface 104. For example, a taper angle of the trench structures 134 with respect to the vertical direction may be equal to the off-axis angle or may deviate from the off-axis angle by not more than ±1 degree such that at least the first sidewall 106 of two opposite longitudinal sidewalls 106, 108 is formed by a main crystal plane providing high charge carrier mobility, e.g., a (11-20) crystal plane. The second sidewall 108 opposite to the first sidewall 106 may be tilted to a main crystal plane by twice the off-axis angle α, e.g., by 4 degrees or more, for example, by about 8 degrees. The first and second sidewalls 106, 108 are on opposite longitudinal sides of the intermediate mesa portion and directly adjoin two different, neighboring trench structures 134.

The trench structures 134 include the electrode 112, for example a conductive gate electrode which may include or consist of a heavily doped polycrystalline silicon layer and/or a metal-containing layer. The electrodes 112 may be electrically connected to one another and to a gate terminal G, for example at a location in an edge termination area.

The trench structures 134 further include the trench dielectric 114, for example a gate dielectric separating the electrode 112 from the SiC semiconductor body 100 along at least one side of the trench structure 134. The trench dielectric 114 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The trench dielectric 114 may be formed for a threshold voltage of the transistor cells TC in a range from 1.0 V to 8 V, for example.

The trench structures 134 may exclusively include the electrode 112 and the trench dielectric 114 or may include further conductive and/or dielectric structures in addition to the electrode 112 and the trench dielectric 114.

The mesa portions 136 include the source regions 121 that are oriented to the first surface 104. The source regions 121 may directly adjoin the first surface 104 and may directly adjoin the first sidewall 106 of the respective mesa portion 136. The mesa portions 136 further include the body regions 118 that separate the source regions 121 from the drift zone 128. The body regions 118 form first pn junctions pn1 with the drift zone 128 and second pn junctions pn2 with the source regions 121. The body regions 118 directly adjoin the first sidewall 106. A vertical extension of the body regions 118 corresponds to a channel length of the transistor cells TC and may be in a range from 0.2 μm to 1.5 μm, for example. Both the source regions 121 and the body regions 118 are electrically connected to a first load electrode 138 at the front side.

The first load electrode 138 may form or may be electrically connected or coupled to a first load terminal, which may be a source terminal S of an IGFET, or an anode terminal of an MCD, or an emitter terminal of an IGBT. The second load electrode 132 on the back may form or may be electrically connected or coupled to a second load terminal, which may be a drain terminal D of an IGFET, or a cathode terminal of an MCD, or a collector terminal of an IGBT.

The shielding structure 120 may separate the body region 118 and the second sidewalls 108. The shielding structure 120 may include one, two or even more sub-regions, for example as described and illustrated with reference to FIGS. 1 and 2. A highly doped contact region of the conductivity type of the shielding structure 120 may be arranged at the first surface 104 for improving or for enabling an ohmic contact between the shielding structure 120 and a contact structure at the first surface 104.

In one or more embodiments, the transistor cells TC are n-channel FET cells with p-doped body regions 118, n-doped source regions 121 and an n-doped drift zone 128. According to another embodiment, the transistor cells TC are p-channel FET cells with n-doped body regions 118, p-doped source regions 121 and a p-doped drift zone 128.

The trench dielectric 114 capacitively couples portions of the body regions 118 with the electrode 112. When a potential at the electrode 112 exceeds or falls below a threshold voltage of the semiconductor device 1000, the electric field effects that minority charge carriers in the body regions 118 form inversion channels along the trench dielectric 114, wherein the inversion channels connect the source regions 121 with the drift zone 128, thereby turning on the semiconductor device 1000. In the on-state, a load current flows through the SiC semiconductor body 100 approximately along the first sidewalls 106 between the first and second load electrodes 132, 138. At the same time the higher dopant concentration in the shielding structure 120 suppresses the formation of inversion channels along the second sidewalls 108.

FIG. 9 is a schematic flow-chart for illustrating a method 2000 of manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases. Information provided above with reference to FIGS. 1A to 8B apply likewise.

Referring to FIG. 9, process feature S100 comprises forming a first trench into a SiC semiconductor body from a first surface, for example by an etch process using a patterned hard mask. A depth of the first trench may be set to range from 10 nm to 100 nm, for example.

Process feature S110 comprises forming a shielding structure of a first conductivity type in the SiC semiconductor body by introducing dopants of the first conductivity type through a bottom of the first trench into the SiC semiconductor body. The dopants may be introduced into the SiC semiconductor body by one or more ion implantations, for example. Activation of the dopants by thermal processing may follow, for example at temperatures ranging from 1700° C. to 1800° C.

Process feature S120 comprises forming a second trench into the SiC semiconductor body from the first surface, wherein the second trench extends deeper into the SiC semiconductor body than the first trench, and the first trench and the second trench laterally merge one another, thereby setting a second section of a trench bottom of the second trench deeper in the SiC semiconductor body than a first section of the trench bottom of the second trench.

FIGS. 10A to 10I refer to schematic cross-sectional views for illustrating a method of manufacturing a semiconductor device, for example the semiconductor device 1000 illustrated in the embodiments depicted in FIGS. 1 to 8B.

Figure 10A:
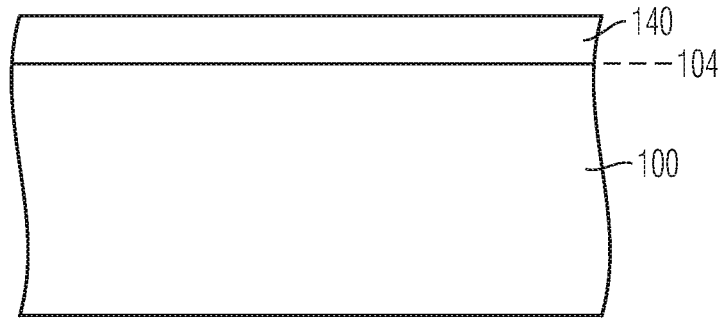
FIGS. 10A to 10I are schematic cross-sectional views of a SiC semiconductor body for illustrating process features of a method for manufacturing a semiconductor device.

Referring to the schematic cross-sectional view of FIG. 10A, a hard mask layer 140, for example a dielectric layer such as an oxide layer is formed on the first surface 104 of the SiC semiconductor body 100, for example by a deposition process. A thickness of the hard mask layer 140 may be chosen so as to block ions in high energy ion implantation processes that may follow at a later stage of processing. In one or more embodiments, a thickness of the mask layer may range from 2 μm to 10 μm, for example.

Figure 10B:
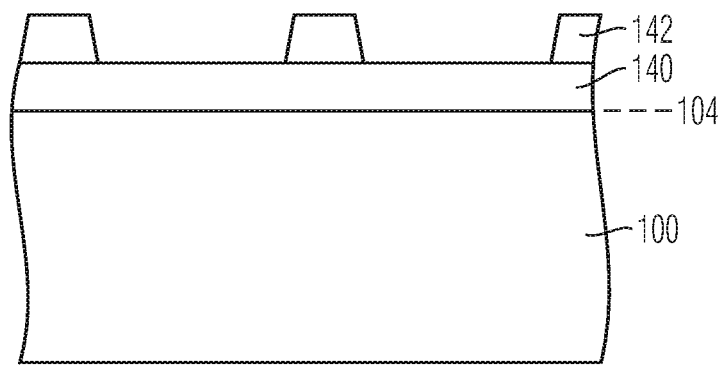

Referring to the schematic cross-sectional view of FIG. 10B, a resist mask layer is formed on the hard mask layer 140 and is lithographically patterned, thereby forming a resist mask 142.

Figure 10C:
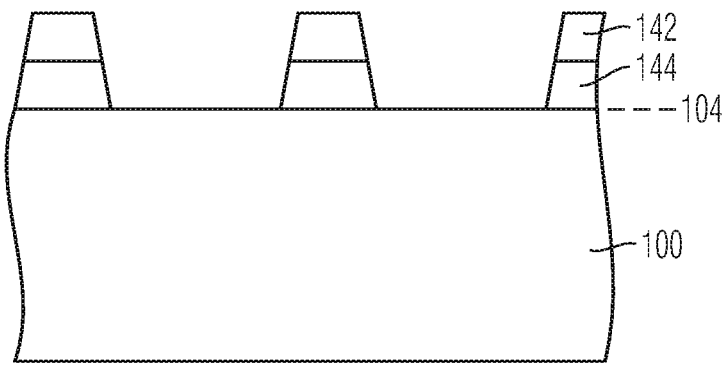

Referring to the schematic cross-sectional view of FIG. 10C, the hard mask layer 140 is patterned into a hard mask 144 by an etch process using the resist mask 142.

Figure 10D:
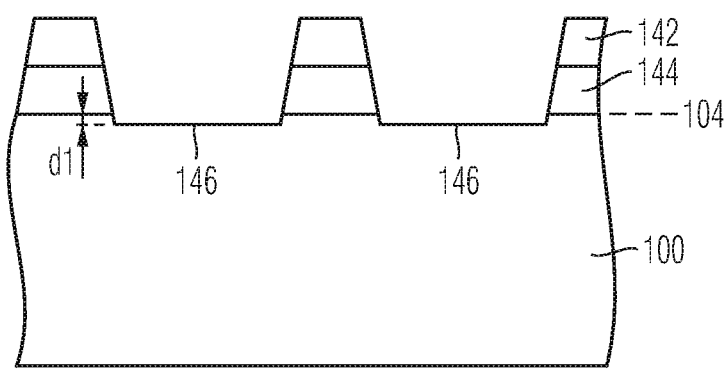

Referring to the schematic cross-sectional view of FIG. 10D, a first trench 146 is formed into the SiC semiconductor body 100 from the first surface 104, for example by an etch process. Patterning of the hard mask layer 140 and formation of the first trench 146 may be carried out in a common etch process, for example. A depth d1 of the first trench 146 may be set to range from 10 nm to 100 nm, for example.

Figure 10E:
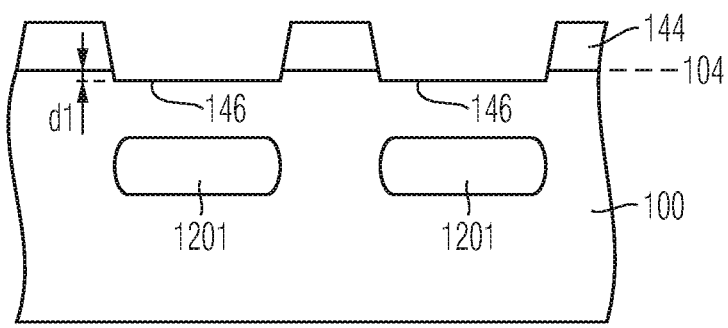

Referring to the schematic cross-sectional view of FIG. 10E, dopants of the shielding region are introduced through openings of the hard mask 144 and through a bottom of the first trench 146 into the SiC semiconductor body 100 by a high energy ion implantation process, for example by setting an ion implantation energy ranging from 1 MeV to 6 MeV depending on a dopant species, e.g. aluminum (Al) or boron (B) for p-type doping.

Figure 10F:
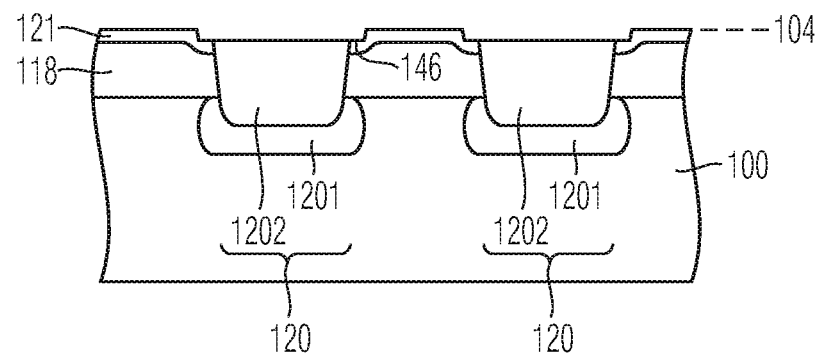

Referring to the schematic cross-sectional view of FIG. 10F, further dopants are introduced into the SiC semiconductor body 100 by masked ion implantation processes, thereby forming the source region 121, the body region 118, and the connection region 1202, for example. Further regions not illustrated in FIG. 10F, for example the current spread zone 126 illustrated in FIG. 7 may be formed.

Figure 10G:
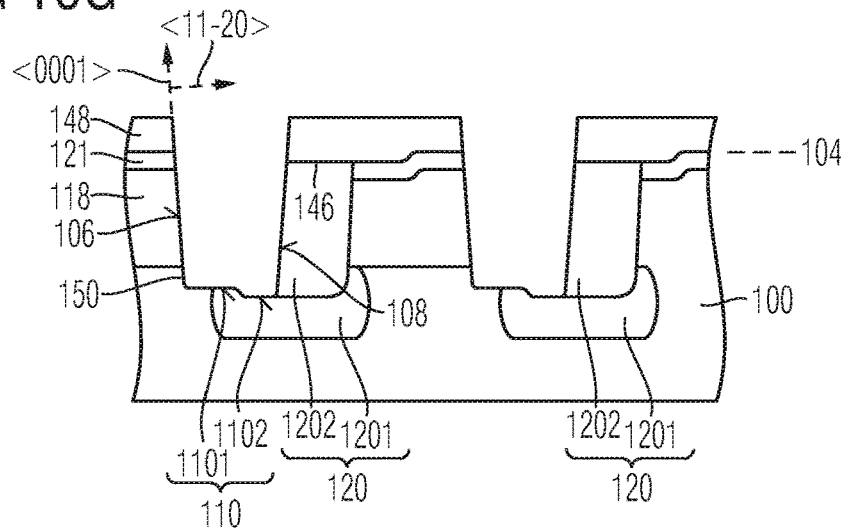

Referring to the schematic cross-sectional view of FIG. 10G, a patterned mask 148, for example a hard mask as described with reference to FIGS. 10A and 10B or a patterned resist mask, is formed on the first surface 104. Thereafter, a second trench 150 is formed into the SiC semiconductor body 100 from the first surface 104. The second trench 150 extends deeper into the SiC semiconductor body 100 than the first trench 146. The first trench 146 and the second trench 150 laterally merge one another, thereby setting the second section 1102 of the trench bottom 110 of the second trench 150 deeper in the SiC semiconductor body 100 than the first section 1101 of the trench bottom 110 of the second trench 150. The second trench 150 may correspond to the trench 102 described with reference to the embodiments illustrated in FIGS. 1 to 8B, for example. A taper angle of the first sidewall 106 with respect to the vertical direction y may be equal to the off-axis angle or may deviate from the off-axis angle by not more than ±1 degree such that the first sidewall 106 is formed by a main crystal plane providing high charge carrier mobility, e.g., a (11-20) crystal plane. The second sidewall 108 opposite to the first sidewall 106 may be tilted to a main crystal plane by twice the off-axis angle α, e.g., by 4 degrees or more, for example, by about 8 degrees.

Figure 10H:
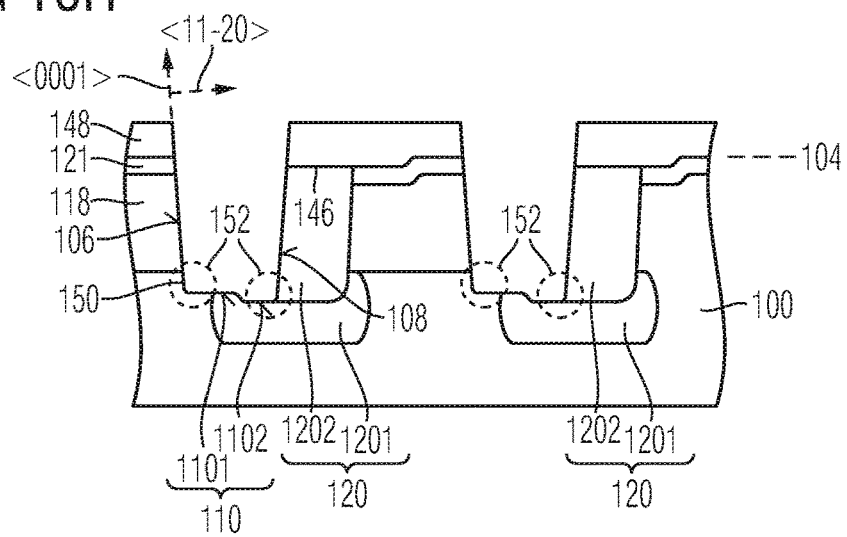

Referring to the schematic cross-sectional view of FIG. 10H, corners 152 at a transition between the trench bottom and the sidewalls 106, 108 are rounded, for example by a high temperature annealing process in a non-oxidizing and non-nitriding atmosphere such as a hydrogen ($H_2$) or argon (Ar) atmosphere. The high temperature annealing process may be carried out for several minutes, for example in a range from 2 to 20 minutes in a temperature range of 1400° C. and 1600° C. The high temperature annealing process may further bring the first sidewall 106 into closer alignment with the (11-20) crystal plane.

Figure 10I:
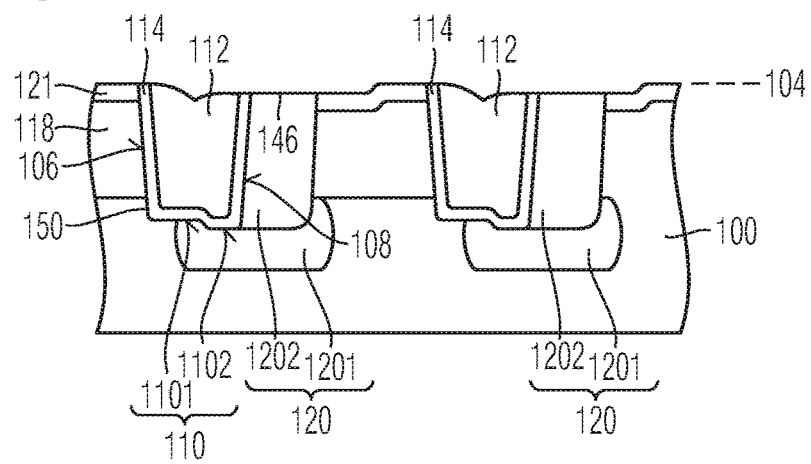

Referring to the schematic cross-sectional view of FIG. 10I, the trench dielectric 114 is formed, for example by a layer deposition process and/or thermal oxidation. Layer deposition may provide the benefit of less or no dependency of the crystallographic plane compared with thermal oxidation, for example. An optional sacrificial dielectric, for example a sacrificial oxide, that has been formed before formation of the trench dielectric 114 may be removed partly or completely. By way of example, a part of a sacrificial dielectric may remain at the corners 152, for example. The trench dielectric 114 may also be formed by more than one layer deposition process for achieving trench dielectric portions having different thickness, for example as is illustrated in the embodiment of FIG. 5. As an example, a dielectric may be formed by a high density plasma (HDP) process and subsequently be removed from the first and second sidewalls 106, 108, thereby leading to a trench dielectric 114 that has a larger thickness at the trench bottom 110 compared with the first and second sidewalls 106, 108. The electrode 112 may be formed by layer deposition of highly doped semiconductor material and/or metal.

Further known processes may follow for finalizing the semiconductor device.

In the following, further embodiments of the semiconductor device and/or the method as described herein are explained.

According to at least one embodiment, the semiconductor device comprises a trench extending from a first surface into a SiC semiconductor body, the trench having a first sidewall, a second sidewall opposite to the first sidewall, and a trench bottom. The semiconductor device further comprises a gate electrode arranged in the trench and electrically insulated from the SiC semiconductor body by a gate dielectric. In this embodiment, the semiconductor device further comprises a body region of a first conductivity type adjoining the first sidewall and a shielding structure of the first conductivity type adjoining at least a portion of the second sidewall and the trench bottom. Along a vertical direction extending from the first surface to a second surface of the SiC semiconductor body opposite to the first surface, a first section of the trench bottom and a second section of the trench bottom are offset to one another by a vertical offset.

According to at least one embodiment of the semiconductor device, the shielding structure includes a shielding region of the first conductivity type and a connection region of the first conductivity type, the connection region being arranged between the shielding region and the first surface, wherein a doping concentration profile of the shielding region has a peak along the vertical direction that is located deeper in the SiC semiconductor body than the trench bottom.

According to at least one embodiment of the semiconductor device, a vertical distance between the first section of the trench bottom and the peak of the shielding region ranges from 200 nm to 800 nm.

According to at least one embodiment of the semiconductor device, the second section of the trench bottom is arranged deeper in the SiC semiconductor body than the first section of the trench bottom.

According to at least one embodiment of the semiconductor device, the vertical offset ranges from 10 nm to 100 nm.

According to at least one embodiment of the semiconductor device, a second section of a bottom of the gate electrode is arranged deeper in the SiC semiconductor body along the vertical direction than a first section of the bottom of the gate electrode.

According to at least one embodiment of the semiconductor device, the semiconductor device comprises a source region of a second conductivity type between the body region and the first surface. A first portion of the source region is arranged between the first sidewall of the trench and a second portion of the source region, and a bottom of the second portion is arranged deeper in the SiC semiconductor body along the vertical direction than a bottom of the first portion.

According to at least one embodiment of the semiconductor device, a vertical distance between the bottom of the first portion of the source region and the bottom of the second portion of the source region corresponds to a vertical distance between the first section of the trench bottom and the second section of the trench bottom.

According to at least one embodiment of the semiconductor device, the shielding structure adjoins the second sidewall at the first surface.

According to at least one embodiment of the semiconductor device, the semiconductor device comprises a region of the second conductivity type adjoining the second sidewall and the first surface.

According to at least one embodiment of the semiconductor device, a thickness of a first part of the gate dielectric adjoining the trench bottom is greater than a thickness of a second part of the gate dielectric adjoining the first and second sidewalls.

According to at least one embodiment of the semiconductor device, the semiconductor device comprises a current spread zone of the second conductivity type and a drift zone of the second conductivity type. The current spread zone is arranged between the body region and the drift zone. The current spread zone may adjoin the body region and the shielding structure. An average net doping concentration of the current spread zone may be greater than an average net doping concentration of the drift zone.

According to at least one embodiment of the semiconductor device, the SiC semiconductor body is a 4H-SiC semiconductor body, and a sidewall plane of the first sidewall is (11-20).

According to at least one embodiment of the semiconductor device, the semiconductor device comprises a plurality of transistor cells electrically connected in parallel. Each one of the plurality of transistor cells comprises the trench, the gate dielectric, the gate electrode, and the shielding structure.

According to at least one embodiment, the method for manufacturing a semiconductor device, comprises the steps of forming a first trench into a SiC semiconductor body from a first surface; forming a shielding structure of a first conductivity type in the SiC semiconductor body by introducing dopants of the first conductivity type through a bottom of the first trench into the SiC semiconductor body; and forming a second trench into the SiC semiconductor body from the first surface. The second trench extends deeper into the SiC semiconductor body than the first trench, and the first trench and the second trench laterally merge one another, thereby setting a second section of a trench bottom of the second trench deeper in the SiC semiconductor body than a first section of the trench bottom of the second trench.

According to at least one embodiment of the method of manufacturing a semiconductor device, the method further comprises forming a first trench comprises etching the SiC semiconductor body covered by a patterned hard mask.

According to at least one embodiment of the method of manufacturing a semiconductor device, a depth of the first trench is set to range from 10 nm to 100 nm.

According to at least one embodiment of the method of manufacturing a semiconductor device, forming the shielding structure comprises introducing dopants of the first conductivity type into the SiC semiconductor body by at least one ion implantation with an ion implantation energy ranging from 1 MeV to 6 MeV.

According to at least one embodiment of the method of manufacturing a semiconductor device, forming the shielding structure comprises forming a shielding region of the first conductivity type and forming a connection region of the first conductivity type, the connection region being arranged between the shielding region and the first surface, wherein a doping concentration profile of the shielding region along a vertical direction perpendicular to the first surface is set to have a peak, and the peak is set deeper in the SiC semiconductor body than the trench bottom of the second trench.

According to at least one embodiment of the method of manufacturing a semiconductor device, a vertical distance between the first section of the trench bottom and the peak of the shielding region is set to range from 200 nm to 800 nm.

According to at least one embodiment of the method of manufacturing a semiconductor device, the method comprises forming a source region before forming a second trench into the SiC semiconductor body, and lining first and second sidewalls and the trench bottom of the second trench with a gate dielectric, and forming a gate electrode in the second trench.

The method described herein may be used for manufacturing a semiconductor device as described herein. That is to say, all features disclosed in connection with the method may also be disclosed for the semiconductor device and vice versa.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a trench extending from a first surface into a SiC semiconductor body, the trench having a first sidewall, a second sidewall opposite to the first sidewall, and a trench bottom;
   a gate electrode arranged in the trench and electrically insulated from the SiC semiconductor body by a gate dielectric;
   a body region of a first conductivity type adjoining the first sidewall; and
   a shielding structure of the first conductivity type adjoining at least a portion of the second sidewall and the trench bottom,
   wherein along a vertical direction extending from the first surface to a second surface of the SiC semiconductor body opposite to the first surface, a first section of the trench bottom, which adjoins the first sidewall, and a second section of the trench bottom, which adjoins the second sidewall, are offset to one another by a vertical offset so that the second section of the trench bottom which adjoins the second sidewall is arranged deeper in the SiC semiconductor body than the first section of the trench bottom which adjoins the first sidewall,
   wherein a second section of a bottom of the gate electrode which adjoins the second section of the trench bottom is arranged deeper in the SiC semiconductor body along the vertical direction than a first section of the bottom of the gate electrode which adjoins the first section of the trench bottom.

2. The semiconductor device of claim 1, wherein the shielding structure includes a shielding region of the first conductivity type and a connection region of the first conductivity type, the connection region being arranged between the shielding region and the first surface, wherein a doping concentration profile of the shielding region has a peak along the vertical direction that is located deeper in the SiC semiconductor body than the trench bottom.

3. The semiconductor device of claim 2, wherein a vertical distance between the first section of the trench bottom and the peak of the shielding region ranges from 200 nm to 800 nm.

4. The semiconductor device of claim 1, wherein the vertical offset ranges from 10 nm to 100 nm.

5. The semiconductor device of claim 1, further comprising:
   a source region of a second conductivity type between the body region and the first surface,
   wherein a first portion of the source region is arranged between the first sidewall of the trench and a second portion of the source region,
   wherein a bottom of the second portion of the source region is arranged deeper in the SiC semiconductor body along the vertical direction than a bottom of the first portion.

6. The semiconductor device of claim 5, wherein a vertical distance between the bottom of the first portion of the source region and the bottom of the second portion of the source region corresponds to a vertical distance between the first section of the trench bottom and the second section of the trench bottom.

7. The semiconductor body of claim 1, wherein the shielding structure adjoins the second sidewall at the first surface.

8. The semiconductor device of claim 1, further comprising a region of a second conductivity type adjoining the second sidewall and the first surface.

9. The semiconductor device of claim 1, wherein a thickness of a first part of the gate dielectric adjoining the trench bottom is greater than a thickness of a second part of the gate dielectric adjoining the first and second sidewalls.

10. The semiconductor device of claim 1, further comprising:
   a current spread zone of a second conductivity type; and
   a drift zone of the second conductivity type,
   wherein the current spread zone is arranged between the body region and the drift zone,
   wherein the current spread zone adjoins the body region and the shielding structure, wherein an average net doping concentration of the current spread zone is greater than an average net doping concentration of the drift zone.

11. The semiconductor device of claim 1, wherein the SiC semiconductor body is a 4H-SiC semiconductor body, and wherein a sidewall plane of the first sidewall is (11-20).

12. The semiconductor device of claim 1, further comprising:
a plurality of transistor cells electrically connected in parallel,
wherein each one of the plurality of transistor cells comprises the trench, the gate dielectric, the gate electrode, and the shielding structure.

13. A method of manufacturing a semiconductor device, the method comprising:
forming a first trench extending from a first surface into a SiC semiconductor body;
forming a shielding structure of a first conductivity type in the SiC semiconductor body by introducing dopants of a first conductivity type through a bottom of the first trench into the SiC semiconductor body;
forming a second trench extending from the first surface into the SiC semiconductor body; and
forming a gate electrode in the second trench,
wherein the second trench extends deeper into the SiC semiconductor body than the first trench,
wherein the first trench and the second trench laterally merge one another so as to set a second section of a trench bottom of the second trench deeper in the SiC semiconductor body than a first section of the trench bottom of the second trench, and so that a second section of a bottom of the gate electrode is arranged deeper in the SiC semiconductor body along the vertical direction than a first section of the bottom of the gate electrode.

14. The method of claim 13, wherein forming the first trench comprises etching the SiC semiconductor body covered by a patterned hard mask.

15. The method of claim 13, wherein a depth of the first trench ranges from 10 nm to 100 nm.

16. The method of claim 13, wherein forming the shielding structure comprises introducing dopants of the first conductivity type into the SiC semiconductor body by at least one ion implantation with an ion implantation energy ranging from 1 MeV to 6 MeV.

17. The method of claim 13, wherein forming the shielding structure comprises:
forming a shielding region of the first conductivity type; and
forming a connection region of the first conductivity type, the connection region being arranged between the shielding region and the first surface,
wherein a doping concentration profile of the shielding region along a vertical direction perpendicular to the first surface is set to have a peak,
wherein the peak is set deeper in the SiC semiconductor body than the trench bottom of the second trench.

18. The method of claim 17, wherein a vertical distance between the first section of the trench bottom and the peak of the shielding region ranges from 200 nm to 800 nm.

19. The method of claim 13, further comprising:
forming a source region before forming the second trench; and
lining first and second sidewalls and a bottom of the second trench with a gate dielectric.

20. A semiconductor device, comprising:
a trench extending from a first surface into a SiC semiconductor body, the trench having a first sidewall, a second sidewall opposite to the first sidewall, and a trench bottom;
a gate electrode arranged in the trench and electrically insulated from the SiC semiconductor body by a gate dielectric;
a body region of a first conductivity type adjoining the first sidewall; and
a shielding structure of the first conductivity type adjoining at least a portion of the second sidewall and the trench bottom,
wherein along a vertical direction extending from the first surface to a second surface of the SiC semiconductor body opposite to the first surface, a first section of the trench bottom and a second section of the trench bottom are offset to one another by a vertical offset,
wherein the shielding structure includes a shielding region of the first conductivity type and a connection region of the first conductivity type, the connection region being arranged between the shielding region and the first surface,
wherein a doping concentration profile of the shielding region has a peak along the vertical direction that is located deeper in the SiC semiconductor body than the trench bottom.

21. A semiconductor device, comprising:
a trench extending from a first surface into a SiC semiconductor body, the trench having a first sidewall, a second sidewall opposite to the first sidewall, and a trench bottom;
a gate electrode arranged in the trench and electrically insulated from the SiC semiconductor body by a gate dielectric;
a body region of a first conductivity type adjoining the first sidewall;
a shielding structure of the first conductivity type adjoining at least a portion of the second sidewall and the trench bottom; and
a source region of a second conductivity type between the body region and the first surface,
wherein along a vertical direction extending from the first surface to a second surface of the SiC semiconductor body opposite to the first surface, a first section of the trench bottom and a second section of the trench bottom are offset to one another by a vertical offset,
wherein a first portion of the source region is arranged between the first sidewall of the trench and a second portion of the source region,
wherein a bottom of the second portion of the source region is arranged deeper in the SiC semiconductor body along the vertical direction than a bottom of the first portion.

22. The semiconductor device of claim 21, wherein a vertical distance between the bottom of the first portion of the source region and the bottom of the second portion of the source region corresponds to a vertical distance between the first section of the trench bottom and the second section of the trench bottom.

23. A semiconductor device, comprising:
a trench extending from a first surface into a SiC semiconductor body, the trench having a first sidewall, a second sidewall opposite to the first sidewall, and a trench bottom;

a gate electrode arranged in the trench and electrically insulated from the SiC semiconductor body by a gate dielectric;

a body region of a first conductivity type adjoining the first sidewall;

a shielding structure of the first conductivity type adjoining at least a portion of the second sidewall and the trench bottom;

a current spread zone of a second conductivity type; and a drift zone of the second conductivity type, wherein along a vertical direction extending from the first surface to a second surface of the SiC semiconductor body opposite to the first surface, a first section of the trench bottom and a second section of the trench bottom are offset to one another by a vertical offset, wherein the current spread zone is arranged between the body region and the drift zone, wherein the current spread zone adjoins the body region and the shielding structure, wherein an average net doping concentration of the current spread zone is greater than an average net doping concentration of the drift zone.

24. A semiconductor device, comprising:

a trench extending from a first surface into a SiC semiconductor body, the trench having a first sidewall, a second sidewall opposite to the first sidewall, and a trench bottom, wherein a sidewall plane of the first sidewall is formed by a main crystal plane of the SiC semiconductor body, and wherein the second sidewall is tilted with respect to the main crystal plane;

a gate electrode arranged in the trench and electrically insulated from the SiC semiconductor body by a gate dielectric;

a body region of a first conductivity type adjoining the first sidewall;

a shielding structure of the first conductivity type adjoining at least a portion of the second sidewall and the trench bottom; and a source region of a second conductivity type formed exclusively along the first sidewall, wherein along a vertical direction extending from the first surface to a second surface of the SiC semiconductor body opposite to the first surface, a first section of the trench bottom and a second section of the trench bottom are offset to one another by a vertical offset.

* * * * *